(12) United States Patent
Xuan

(10) Patent No.: US 10,629,108 B2
(45) Date of Patent: Apr. 21, 2020

(54) SHIFT REGISTER UNIT AND DRIVE METHOD THEREOF, SHIFT REGISTER AND DISPLAY DEVICE

(71) Applicant: BOE TECHNOLOGY GROUP CO., LTD., Beijing (CN)

(72) Inventor: Minghua Xuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 76 days.

(21) Appl. No.: 15/773,873

(22) PCT Filed: Oct. 13, 2017

(86) PCT No.: PCT/CN2017/106088
§ 371 (c)(1),
(2) Date: May 4, 2018

(87) PCT Pub. No.: WO2018/196291
PCT Pub. Date: Nov. 1, 2018

(65) Prior Publication Data
US 2019/0073933 A1    Mar. 7, 2019

(30) Foreign Application Priority Data

Apr. 28, 2017   (CN) .......................... 2017 1 0295732

(51) Int. Cl.
*G09G 3/20* (2006.01)
*G11C 19/28* (2006.01)
(Continued)

(52) U.S. Cl.
CPC ............. *G09G 3/20* (2013.01); *G09G 3/3266* (2013.01); *G09G 3/3677* (2013.01); *G11C 19/28* (2013.01); *G09G 2310/0286* (2013.01)

(58) Field of Classification Search
None
See application file for complete search history.

(56) References Cited

U.S. PATENT DOCUMENTS

2005/0201508 A1   9/2005  Shin et al.
2015/0262703 A1*  9/2015  Murakami ............... G09G 3/20
                                                          345/214
(Continued)

FOREIGN PATENT DOCUMENTS

CN    104900268 A     9/2015
CN    105185287    * 12/2015
(Continued)

OTHER PUBLICATIONS

International Search Report from PCT Application No. PCT/CN2017/106088 dated Jan. 30, 2018 (5 pages).
(Continued)

*Primary Examiner* — Patrick N Edouard
*Assistant Examiner* — Peijie Shen
(74) *Attorney, Agent, or Firm* — Dave Law Group LLC; Raj S. Dave

(57) ABSTRACT

Embodiments of the present disclosure provide a shift register unit, which includes an input circuit configured to control a voltage of a first node based on an input signal and a first clock signal; an first control circuit configured to control a voltage of a second node based on a first voltage, the first clock signal, and the voltage of the first node; an second control circuit configured to control a voltage of a third node based on the voltage of the second node and a second clock signal; a first hold circuit configured to hold the voltage of the first node based on a second voltage and the voltage of the third node; a second hold circuit configured to hold the voltage of the second node and of the third node; and an output circuit configured to output the first voltage or the second voltage from an output terminal.

20 Claims, 8 Drawing Sheets

(51) Int. Cl.
*G09G 3/3266* (2016.01)
*G09G 3/36* (2006.01)

(56) References Cited

U.S. PATENT DOCUMENTS

| | | | |
|---|---|---|---|
| 2015/0279480 A1* | 10/2015 | Murakami | G09G 3/20 345/100 |
| 2016/0379558 A1* | 12/2016 | Jeon | G09G 3/3225 345/213 |
| 2017/0200418 A1 | 7/2017 | Zhang et al. | |
| 2017/0256204 A1 | 9/2017 | Xiang et al. | |
| 2018/0190364 A1* | 7/2018 | Gu | G11C 19/184 |
| 2019/0130857 A1* | 5/2019 | Ma | G09G 3/20 |

FOREIGN PATENT DOCUMENTS

| CN | 105185287 A | | 12/2015 |
|---|---|---|---|
| CN | 106486065 A | | 3/2017 |
| CN | 106601177 | * | 4/2017 |
| CN | 106601177 A | | 4/2017 |
| CN | 106887209 A | | 6/2017 |

OTHER PUBLICATIONS

Written Opinion from PCT Application No. PCT/CN2017/106088 dated Jan. 30, 2018 (6 pages).

* cited by examiner

SHIFT REGISTER UNIT AND DRIVE METHOD THEREOF, SHIFT REGISTER AND DISPLAY DEVICE

CROSS-REFERENCE TO RELATED APPLICATION

This application claims the benefit and priority of Chinese Patent Application No. 201710295732.1 filed on Apr. 28, 2017, the entire content of which is incorporated herein by reference as a part of the present application.

TECHNICAL FIELD

The present disclosure relates to the field of display technologies, and more particularly to a shift register unit and a drive method thereof, a shift register and a display device.

BACKGROUND

At present, in the technical field of display panels, organic light emitting diode (OLED) display panels are growing rapidly, and also great progress has been made on the technologies relating to shift registers on array substrates. One of common shift register circuits is a gate drive circuit. The gate drive circuit sequentially outputs a gate scanning signal to respective gate line connected to each row of pixels. The gate scanning signal controls a pixel drive circuit to drive the OLED to emit light. A threshold voltage of a drive transistor in the pixel drive circuit may drift with time. Therefore, generally, the pixel drive circuit may compensate the threshold voltage during the light emission preparation phase of the OLED, such that the electric current flowing through the OLED is unrelated to the threshold voltage. In the process of controlling the pixel drive circuit, another shift register circuit may be employed to control the light emission time and time sequence of the OLED.

SUMMARY

Embodiments set forth herein provide a shift register unit having an output signal of an adjustable duty cycle and a simple circuit structure and a drive method thereof, a shift register, and a display device.

A first aspect of the present disclosure provides a shift register unit. The shift register unit includes an input circuit, a first control circuit, a second control circuit, a first hold circuit, a second hold circuit, and an output circuit. The input circuit is configured to control a voltage of a first node based on an input signal from an input terminal and a first clock signal from a first clock signal terminal. The first control circuit is configured to control a voltage of a second node based on a first voltage from a first voltage terminal, the first clock signal, and the voltage of the first node. The second control circuit is configured to control a voltage of a third node based on the voltage of the second node and a second clock signal from a second clock signal terminal. The first hold circuit is configured to hold the voltage of the first node based on a second voltage from a second voltage terminal and the voltage of the third node. The second hold circuit is configured to hold the voltage of the second node and the voltage of the third node. The output circuit is configured to output the first voltage or the second voltage from an output terminal under the control of the voltage of the first node and the voltage of the third node.

In embodiments of the present disclosure, the input circuit includes a first transistor. A control electrode of the first transistor is coupled to the first clock signal terminal, a first electrode of the first transistor is coupled to the input terminal, and a second electrode of the first transistor is coupled to the first node.

In embodiments of the present disclosure, the first control circuit includes a second transistor and a third transistor. A control electrode of the second transistor is coupled to the first clock signal terminal, a first electrode of the second transistor is coupled to the first voltage terminal, and a second electrode of the second transistor is coupled to the second node. A control electrode of the third transistor is coupled to the first node, a first electrode of the third transistor is coupled to the first clock signal terminal, and a second electrode of the third transistor is coupled to the second node.

In embodiments of the present disclosure, the second control circuit includes a fourth transistor. A control electrode of the fourth transistor is coupled to the second node, a first electrode of the fourth transistor is coupled to a second clock signal terminal, and a second electrode of the fourth transistor is coupled to a third node.

In embodiments of the present disclosure, the first hold circuit includes a first capacitor and a fifth transistor. A first terminal of the first capacitor is coupled to a second voltage terminal, and a second terminal of the first capacitor is coupled to the first node. A control electrode of the fifth transistor is coupled to the third node, a first electrode of the fifth transistor is coupled to the second voltage terminal, and a second electrode of the fifth transistor is coupled to the first node.

In embodiments of the present disclosure, the second hold circuit includes a second capacitor. A first terminal of the second capacitor is coupled to the second node, and a second terminal of the second capacitor is coupled to the third node.

In further embodiments of the present disclosure, the second hold circuit also includes a third capacitor. A first terminal of the third capacitor is coupled to the third node, and a second terminal of the third capacitor is coupled to the second voltage terminal.

In embodiments of the present disclosure, the output circuit includes a sixth transistor and a seventh transistor. A control electrode of the sixth transistor is coupled to the first node, a first electrode of the sixth transistor is coupled to the first voltage terminal, and a second electrode of the sixth transistor is coupled to the output terminal. A control electrode of the seventh transistor is coupled to the third node, a first electrode of the seventh transistor is coupled to the second voltage terminal, and a second electrode of the seventh transistor is coupled to the output terminal.

In embodiments of the present disclosure, all the transistors in the shift register unit are P-type transistors, a low voltage signal is provided from the first voltage terminal, and a high voltage signal is provided from the second voltage terminal.

In embodiments of the present disclosure, all the transistors in the shift register unit are N-type transistors, a high voltage signal is provided from the first voltage terminal, and a low voltage signal is provided from the second voltage terminal.

In embodiments of the present disclosure, the first clock signal and the second clock signal have the same clock period and amplitude, and have opposite phases, and a duty cycle of the first clock signal and a duty cycle of the second clock signal are both ½.

A second aspect of the present disclosure provides a shift register unit. The shift register unit includes a first transistor, a second transistor, a third transistor, a fourth transistor, a fifth transistor, a sixth transistor, a seventh transistor, a first capacitor, a second capacitor, and a third capacitor. A control electrode of the first transistor is coupled to the first clock signal terminal, a first electrode of the first transistor is coupled to the input terminal, and a second electrode of the first transistor is coupled to the first node. A control electrode of the second transistor is coupled to the first clock signal terminal, a first electrode of the second transistor is coupled to the first voltage terminal, and a second electrode of the second transistor is coupled to the second node. A control electrode of the third transistor is coupled to the first node, a first electrode of the third transistor is coupled to the first clock signal terminal, and a second electrode of the third transistor is coupled to the second node. A control electrode of the fourth transistor is coupled to the second node, a first electrode of the fourth transistor is coupled to a second clock signal terminal, and a second electrode of the fourth transistor is coupled to a third node. A first terminal of the first capacitor is coupled to a second voltage terminal, and a second terminal of the first capacitor is coupled to the first node. A control electrode of the fifth transistor is coupled to the third node, a first electrode of the fifth transistor is coupled to the second voltage terminal, and a second electrode of the fifth transistor is coupled to the first node. A first terminal of the second capacitor is coupled to the second node, and a second terminal of the second capacitor is coupled to the third node. A first terminal of the third capacitor is coupled to the third node, and a second terminal of the third capacitor is coupled to the second voltage terminal. A control electrode of the sixth transistor is coupled to the first node, a first electrode of the sixth transistor is coupled to the first voltage terminal, and a second electrode of the sixth transistor is coupled to the output terminal. A control electrode of the seventh transistor is coupled to the third node, a first electrode of the seventh transistor is coupled to the second voltage terminal, and a second electrode of the seventh transistor is coupled to the output terminal.

In embodiments of the present disclosure, the shift register unit also includes a third capacitor. A first terminal of the third capacitor is coupled to the third node, and a second terminal of the third capacitor is coupled to the second voltage terminal.

A third aspect of the present disclosure provides a drive method for driving the above shift register unit. An input signal of the shift register unit has a first voltage and a second voltage. A duration in which the input signal is at the second voltage is N times a pulse duration of the first clock signal. The N is an odd number. The drive method includes the following phases. During the first phase, the second voltage is inputted to the input terminal, the first voltage is inputted to the first clock signal terminal, and the second voltage is inputted to the second clock signal terminal, so as to provide the second voltage to the first node, to provide the first voltage to the second node, and to provide the second clock signal to the third node, and the first voltage is outputted from the output terminal. During the second phase to the $N^{th}$ phase, the voltage of the second node is held such that the voltage of the third node varies with the voltage of the second clock signal terminal, and the second voltage is outputted from the output terminal. During the $(N+1)^{th}$ phase, the first voltage is inputted to the input terminal, the voltage of the first node and the voltage of the second node are held, and the second clock signal is provided to the third node, and the second voltage is outputted from the output terminal. During the $(N+2)^{th}$ phase, the input signal is provided to the first node, the voltage of the second node is held, and the second clock signal is provided to the third node, and the first voltage is outputted from the output terminal. During the $(N+3)^{th}$ phase, the voltage of the first node and the voltage of the third node are held, and the first clock signal is provided to the second node, and the first voltage is outputted from the output terminal.

In further embodiments of the present disclosure, the N is set to 3, and the drive method includes the following phases. During the first phase, the second voltage is inputted to the input terminal, the first voltage is inputted to the first clock signal terminal, and the second voltage is inputted to the second clock signal terminal, so as to provide the second voltage to the first node, to provide the first voltage to the second node, and to provide the second clock signal to the third node, and the first voltage is outputted from the output terminal. During the second phase, the voltage of the first node and the voltage of the second node are held, and the second clock signal is provided to the third node, and the second voltage is outputted from the output terminal. During the third phase, the voltage of the first node and the voltage of the second node are held, and the second clock signal is provided to the third node, and the second voltage continues to be outputted from the output terminal. During the fourth phase, the first voltage is inputted to the input terminal, the voltage of the first node and the voltage of the second node are held, and the second clock signal is provided to the third node, and the second voltage continues to be outputted from the output terminal. During the fifth phase, the input signal is provided to the first node, the voltage of the second node is held, and the second clock signal is provided to the third node, and the first voltage is outputted from the output terminal. During the sixth phase, the voltage of the first node and the voltage of the third node are held, and the first clock signal is provided to the second node, and the first voltage continues to be outputted from the output terminal.

A fourth aspect of the present disclosure provides a shift register, which includes a plurality of cascaded shift register units as mentioned above. An input terminal of each of the shift register units at any stages is coupled to an output terminal of a previous-stage shift register unit, and a first clock signal of each of the shift register units at any stages has an opposite phase with respect to a first clock signal of the previous-stage shift register unit. An input terminal of a first-stage shift register unit is inputted with a start signal.

A fifth aspect of the present disclosure provides an array substrate, which includes the shift register as mentioned above.

A sixth aspect of the present disclosure provides a display panel, which includes the array substrate as mentioned above.

In embodiments of the present disclosure, the display panel is an LCD display panel or an OLED display panel.

A seventh aspect of the present disclosure provides a display device, which includes the display panel as mentioned above.

The embodiments of the present disclosure provide a shift register unit having a simple structure. The shift register unit uses a small quantity of transistors, and thus the layout area of the array substrate may be reduced, which is advantageous to produce a product with a high resolution. Moreover, the shift register unit according to the embodiments of the present disclosure may have an output signal of an adjustable duty cycle.

BRIEF DESCRIPTION OF DRAWINGS

To describe technical solutions of the embodiments of the present disclosure more clearly, the accompanying drawings of the embodiments will be briefly introduced in the following. It should be known that the accompanying drawings in the following description merely involve some embodiments of the present disclosure, but do not limit the present disclosure, in which.

DETAILED DESCRIPTION

To make the technical solutions and advantages of the embodiments of the present disclosure clearer, the technical solutions in the embodiments of the present disclosure will be described clearly and completely below, in conjunction with the accompanying drawings in the embodiments of the present disclosure. Obviously, the described embodiments are merely some but not all of the embodiments of the present disclosure. All other embodiments obtained by those skilled in the art based on the described embodiments of the present disclosure without creative efforts shall fall within the protecting scope of the present disclosure.

Unless otherwise defined, all terms (including technical and scientific terms) used herein have the same meaning as commonly understood by those skilled in the art to which present disclosure belongs. It will be further understood that terms, such as those defined in commonly used dictionaries, should be interpreted as having a meaning that is consistent with their meaning in the context of the specification and will not be interpreted in an idealized or overly formal sense unless expressly so defined herein. As used herein, the description of "connecting" or "coupling" two or more parts together should refer to the parts being directly combined together or being combined via one or more intermediate components.

In all the embodiments of the present disclosure, a source and a drain (an emitter and a collector) of a transistor are symmetrical, and a current from the source to the drain (from the emitter to the collector) to turn on an N-type transistor is in an opposite direction with respect to the current from the source to the drain (from the emitter and the collector) to turn on an a P-type transistor. Therefore, in the embodiments of the present disclosure, a controlled intermediate terminal of the transistor is referred to as a control electrode, a signal input terminal is referred to as a first electrode, and a signal output terminal is referred to as a second electrode. The transistors used in the embodiments of the present disclosure mainly are switching transistors. In addition, terms such as "first" and "second" are only used to distinguish one element (or a part of the element) from another element (or another part of this element).

Figure 1:
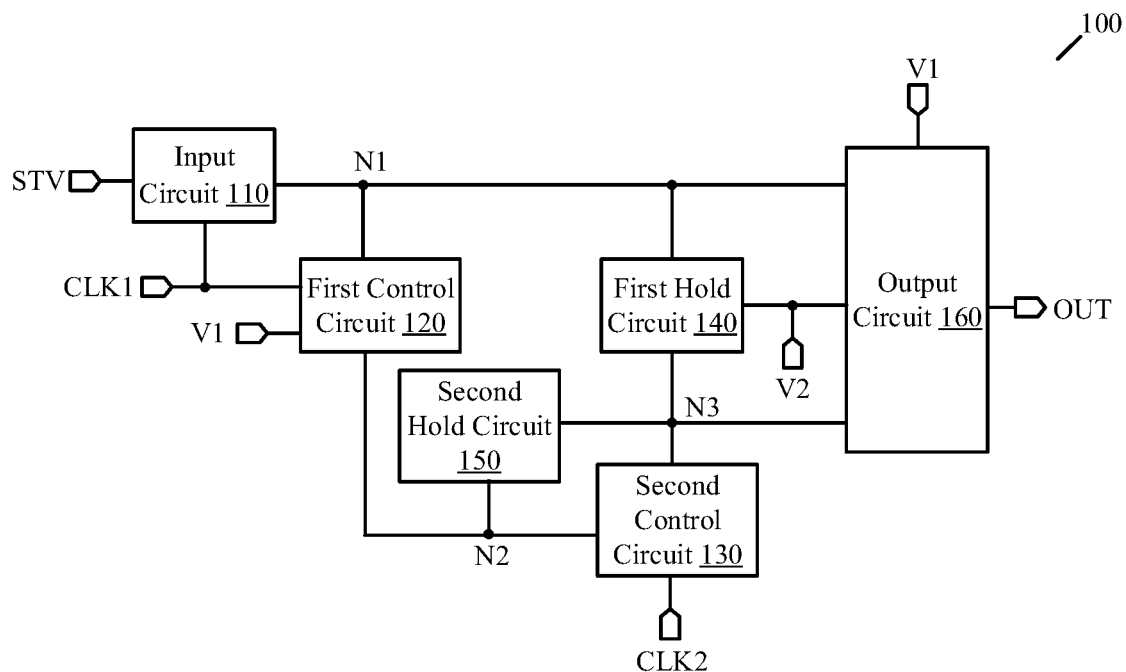
FIG. 1 is a schematic block diagram of a shift register unit according to an embodiment of the present disclosure.

FIG. 1 illustrates a schematic block diagram of a shift register unit 100 according to an embodiment of the present disclosure. As shown in FIG. 1, the shift register unit 100 includes an input circuit 110, a first control circuit 120, a second control circuit 130, a first hold circuit 140, a second hold circuit 150, and an output circuit 160.

The input circuit 110 is connected to the first control circuit 120, the first hold circuit 140 and the output circuit 160, and is configured to control a voltage of a first node N1 based on an input signal from an input terminal STV and a first clock signal from a first clock signal terminal CLK1.

The first control circuit 120 is connected to the input circuit 110, the second control circuit 130, the first hold circuit 140, the second hold circuit 150, and the output circuit 160, and is configured to control a voltage of a second node N2 based on a first voltage from a first voltage terminal V1, the first clock signal, and the voltage of the first node N1.

The second control circuit 130 is connected to the first control circuit 120, the first hold circuit 140, the second hold circuit 150, and the output circuit 160, and is configured to control a voltage of a third node N3 based on the voltage of the second node N2 and a second clock signal from a second clock signal terminal CLK2.

The first hold circuit 140 is connected to the input circuit 110, the first control circuit 120, the second control circuit 130, the second hold circuit 150, and the output circuit 160, and is configured to hold the voltage of the first node N1 based on a second voltage from a second voltage terminal V2 and the voltage of the third node N3.

The second hold circuit 150 is connected to the first control circuit 120, the second control circuit 130, the first hold circuit 140, and the output circuit 160, and is configured to hold the voltage of the second node N2 and the voltage of the third node N3.

The output circuit 160 is connected to the input circuit 110, the first control circuit 120, the second control circuit 130, the first hold circuit 140, and the second hold circuit 150, and is configured to output the first voltage or the second voltage from an output terminal OUT under the control of the voltage of the first node N1 and the voltage of the third node N3.

The shift register unit according to this embodiment is able to output an output signal having the same duty cycle as that of an input signal, and use the output signal as an input signal of a next-stage shift register unit, so as to implement a shift register circuit having an adjustable duty cycle.

Figure 2:
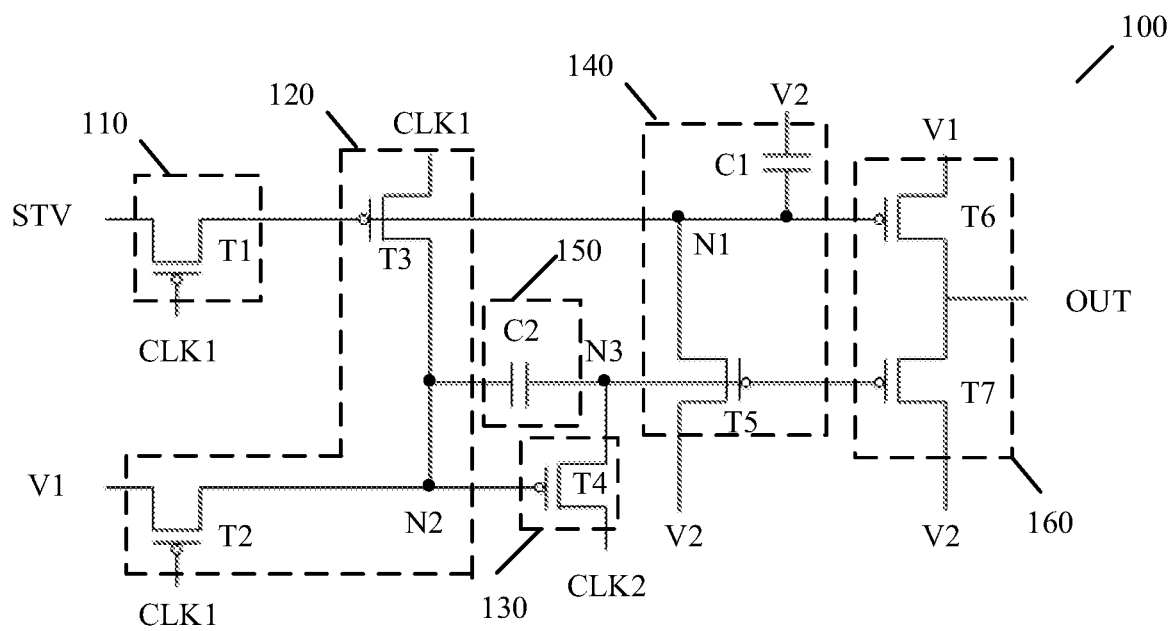
FIG. 2 is an exemplary circuit diagram of a shift register unit according to an embodiment of the present disclosure.

FIG. 2 illustrates an exemplary circuit diagram of the shift register unit 100 according to an embodiment of the present disclosure. As shown in FIG. 2, the input circuit 110 includes a first transistor T1. A control electrode of the first transistor T1 is coupled to the first clock signal terminal CLK1, a first electrode of the first transistor T1 is coupled to the input terminal STV, and a second electrode of the first transistor T1 is coupled to the first node N1.

The first control circuit 120 includes a second transistor T2 and a third transistor T3. A control electrode of the second transistor T2 is coupled to the first clock signal terminal CLK1, a first electrode of the second transistor T2 is coupled to the first voltage terminal V1, and a second electrode of the second transistor T2 is coupled to the second node N2. A control electrode of the third transistor T3 is coupled to the first node N1, a first electrode of the third transistor T3 is coupled to the first clock signal terminal CLK1, and a second electrode of the third transistor T3 is coupled to the second node N2.

The second control circuit 130 includes a fourth transistor T4. A control electrode of the fourth transistor T4 is coupled to the second node N2, a first electrode of the fourth transistor T4 is coupled to a second clock signal terminal CLK2, and a second electrode of the fourth transistor T4 is coupled to a third node N3.

The first hold circuit 140 includes a first capacitor C1 and a fifth transistor T5. A first terminal of the first capacitor C1 is coupled to a second voltage terminal V2, and a second terminal of the first capacitor C1 is coupled to the first node N1. A control electrode of the fifth transistor T5 is coupled to the third node N3, a first electrode of the fifth transistor T5 is coupled to the second voltage terminal V2, and a second electrode of the fifth transistor T5 is coupled to the first node N1.

The second hold circuit 150 includes a second capacitor C2. A first terminal of the second capacitor C2 is coupled to the second node N2, and a second terminal of the second capacitor C2 is coupled to the third node N3.

The output circuit 160 includes a sixth transistor T6 and a seventh transistor T7. A control electrode of the sixth transistor T6 is coupled to the first node N1, a first electrode of the sixth transistor T6 is coupled to the first voltage terminal V1, and a second electrode of the sixth transistor T6 is coupled to the output terminal OUT. A control electrode of the seventh transistor T7 is coupled to the third node N3, a first electrode of the seventh transistor T7 is coupled to the second voltage terminal V2, and a second electrode of the seventh transistor T7 is coupled to the output terminal OUT.

The shift register unit according to this embodiment is simple in structure and uses a small quantity of transistors, and thus the layout area of the array substrate may be reduced, which is advantageous to implement a product with a high resolution. Moreover, the shift register unit may have an output signal of an adjustable duty cycle.

Figure 3:
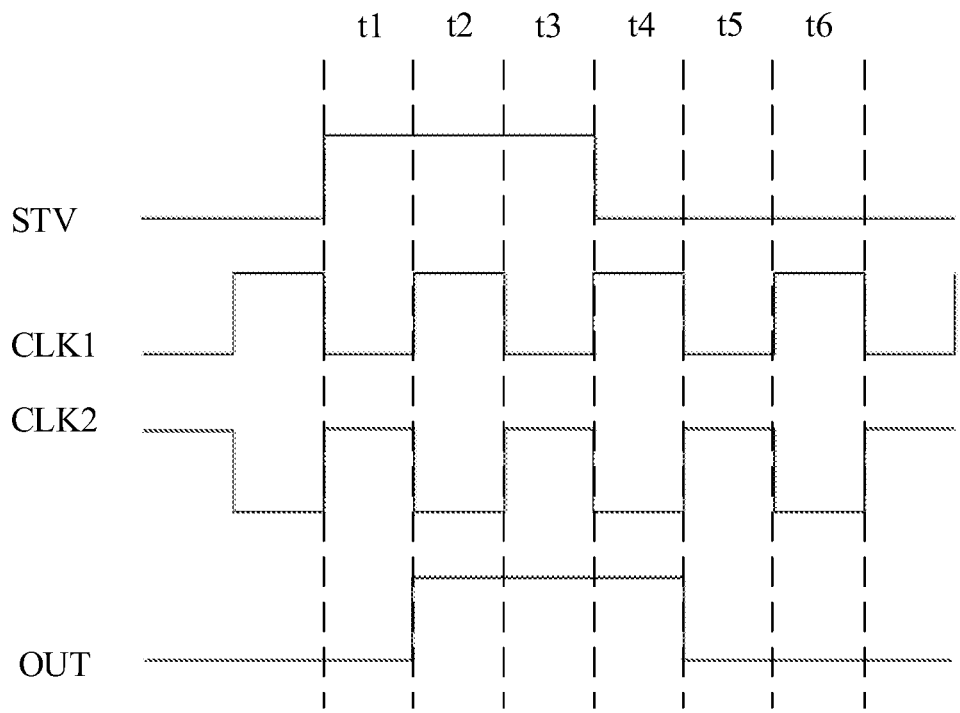
FIG. 3 is a timing diagram of each signal of the shift register unit as shown in FIG. 2.

FIG. 3 illustrates a timing diagram of each signal of the shift register unit 100 as shown in FIG. 2. A working process of the shift register unit 100 as shown in FIG. 2 is described in detail below with reference to the timing diagram as shown in FIG. 3. In the following description, it is assumed that all the transistors are P-type transistors, a low voltage signal VGL is outputted from the first voltage signal terminal V1, and a high voltage signal VGH is outputted from the second voltage signal terminal V2. A first clock signal CK is inputted to the first clock signal terminal CLK1. A second clock signal CKB is inputted to the second clock signal terminal CLK2. The first clock signal CK and the second clock signal CKB have the same clock period and amplitude, and have opposite phases, and a duty cycle of the first clock signal CK and a duty cycle of the second clock signal CKB are both ½. A duration of the high voltage signal VGH of the input signal is three times a pulse duration of the first clock signal. In the following embodiments, "0" represents a low voltage; and "1" represents a high voltage.

Figure 4:
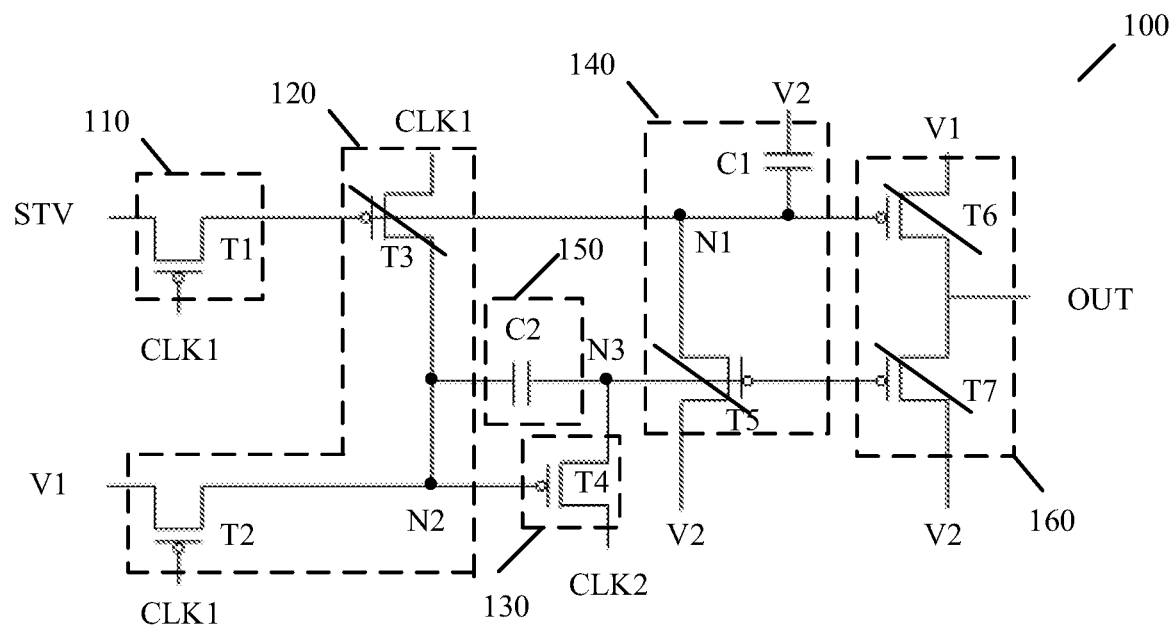
FIG. 4 is an exemplary equivalent circuit diagram of a shift register unit, during the first phase and the third phase, according to an embodiment of the present disclosure.

During the first phase t1, STV=1, CK=0, and CKB=1. The equivalent circuit diagram of the shift register unit 100 in this phase is as shown in FIG. 4, wherein an oblique line on a transistor indicates that the transistor is disabled.

The high voltage signal VGH is inputted to the input terminal STV. Since the low voltage signal VGL is inputted to the first clock signal terminal CLK1, the first transistor T1 is enabled, such that the voltage of the first node N1 is a high voltage. Both the third transistor T3 and the sixth transistor T6 are disabled because the first node N1 has the high voltage. Moreover, the second transistor T2 is enabled by the low voltage signal VGL from the first clock signal terminal CLK1, such that the voltage of the second node N2 is the low voltage. The fourth transistor T4 is enabled by the low voltage of the second node N2, such that the high voltage from the second clock signal terminal CLK2 is inputted to the third node N3. Both the fifth transistor T5 and the seventh transistor T7 are disabled because the third node N3 has the high voltage. The output terminal OUT holds the voltage (i.e., the low voltage) in the previous phase because both the sixth transistor T6 and the seventh transistor T7 are disabled.

Figure 5:
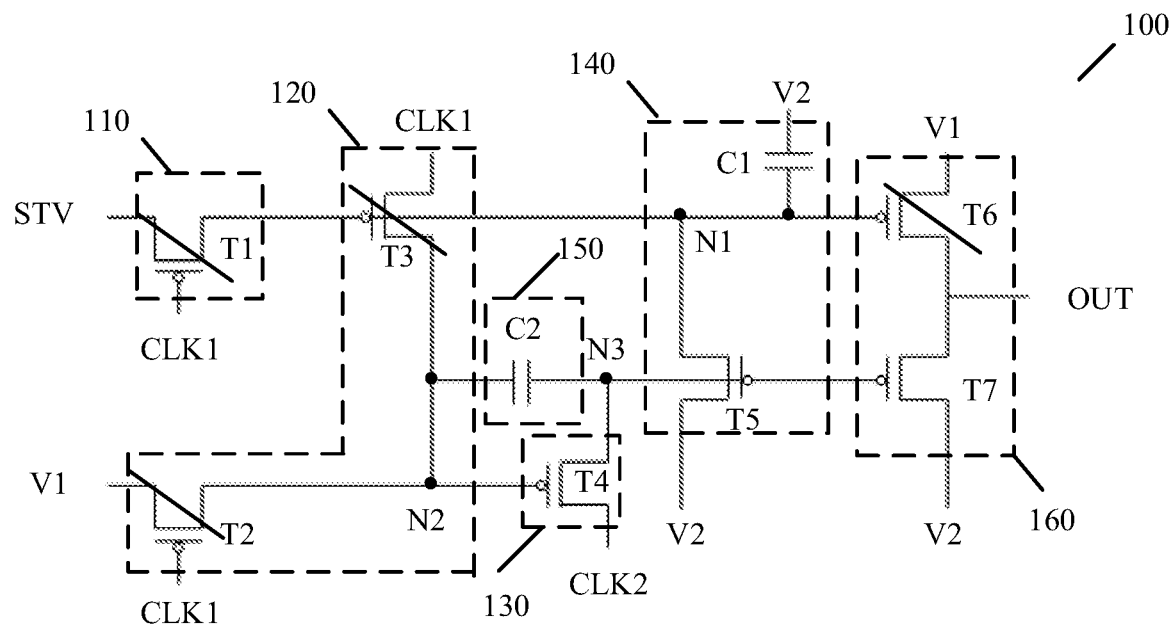
FIG. 5 is an exemplary equivalent circuit diagram of a shift register unit, during the second phase and the fourth phase, according to an embodiment of the present disclosure.

During the second phase t2, STV=1, CK=1, and CKB=0. The equivalent circuit diagram of the shift register unit 100 in this phase is as shown in FIG. 5.

The high voltage signal VGH is inputted to the input terminal STV. Since the high voltage signal VGH is inputted to the first clock signal terminal CLK1, the first transistor T1 is disabled. The voltage of the first node N1 is held as the high voltage by the first capacitor C1. Both the third transistor T3 and the sixth transistor T6 are disabled because the first node N1 has the high voltage. Moreover, the second transistor T2 is disabled by the high voltage signal VGH from the first clock signal terminal CLK1. The voltage of the second node N2 is held as the low voltage by the second capacitor C2. The fourth transistor T4 continues to be enabled by the low voltage of the second node N2, such that the low voltage signal VGL from the second clock signal terminal CLK2 is inputted to the third node N3. Because the voltage of the third node N3 is changed to the low voltage, both the fifth transistor T5 and the seventh transistor T7 are enabled, and the voltage of the second node N2 is lowered by the second capacitor C2 for the second time, such that the fourth transistor T4 is more fully enabled. In the case that the fifth transistor T5 is enabled, the first capacitor C1 is charged by the high voltage signal VGH from the second voltage terminal V2, so as to assist in holding the high voltage of the first node N1. The sixth transistor T6 is disabled and the seventh transistor T7 is enabled. Therefore, the high voltage VGH from the second voltage terminal V2 is outputted from the output terminal OUT.

During the third phase t3, STV=1, CK=0, and CKB=1. The equivalent circuit diagram of the shift register unit 100 in this phase is as shown in FIG. 4.

The high voltage signal VGH is inputted to the input terminal STV. Since the low voltage signal VGL is inputted to the first clock signal terminal CLK1, the first transistor T1 is enabled, such that the voltage of the first node N1 is the high voltage. Both the third transistor T3 and the sixth transistor T6 are disabled because the first node N1 has the high voltage. Moreover, the second transistor T2 is enabled by the low voltage signal VGL from the first clock signal terminal CLK1, such that the voltage of the second node N2 is the low voltage. The fourth transistor T4 is enabled by the low voltage of the second node N2, such that the high voltage from the second clock signal terminal CLK2 is inputted to the third node N3. Both the fifth transistor T5 and the seventh transistor T7 are disabled because the third node N3 has the high voltage. The output terminal OUT holds the voltage (i.e., the high voltage VGH) in the previous phase because both the sixth transistor T6 and the seventh transistor T7 are disabled.

During the fourth phase t4, STV=0, CK=1, and CKB=0. The equivalent circuit diagram of the shift register unit 100 in this phase is as shown in FIG. 5.

The low voltage signal VGL is inputted to the input terminal STV. Since the high voltage signal VGH is inputted to the first clock signal terminal CLK1, the first transistor T1 is disabled. The voltage of the first node N1 is held as the high voltage by the first capacitor C1. Both the third transistor T3 and the sixth transistor T6 are disabled because the first node N1 has the high voltage. Moreover, the second transistor T2 is disabled by the high voltage signal VGH from the first clock signal terminal CLK1. The voltage of the second node N2 is held as the low voltage by the second capacitor C2. The fourth transistor T4 continues to be enabled by the low voltage of the second node N2, such that the low voltage from the second clock signal terminal CLK2 is inputted to the third node N3. Because the voltage of the third node N3 is changed to the low voltage, both the fifth transistor T5 and the seventh transistor T7 are enabled, and the voltage of the second node N2 is lowered by the second capacitor C2 for the second time, such that the fourth transistor T4 is more fully enabled. In the case that the fifth transistor T5 is enabled, the first capacitor C1 is charged by the high voltage from the second voltage terminal V2, so as to assist in holding the high voltage of the first node N1. The sixth transistor T6 is disabled and the seventh transistor T7 is enabled. Therefore, the high voltage from the second voltage terminal V2 is outputted from the output terminal OUT.

Figure 6:
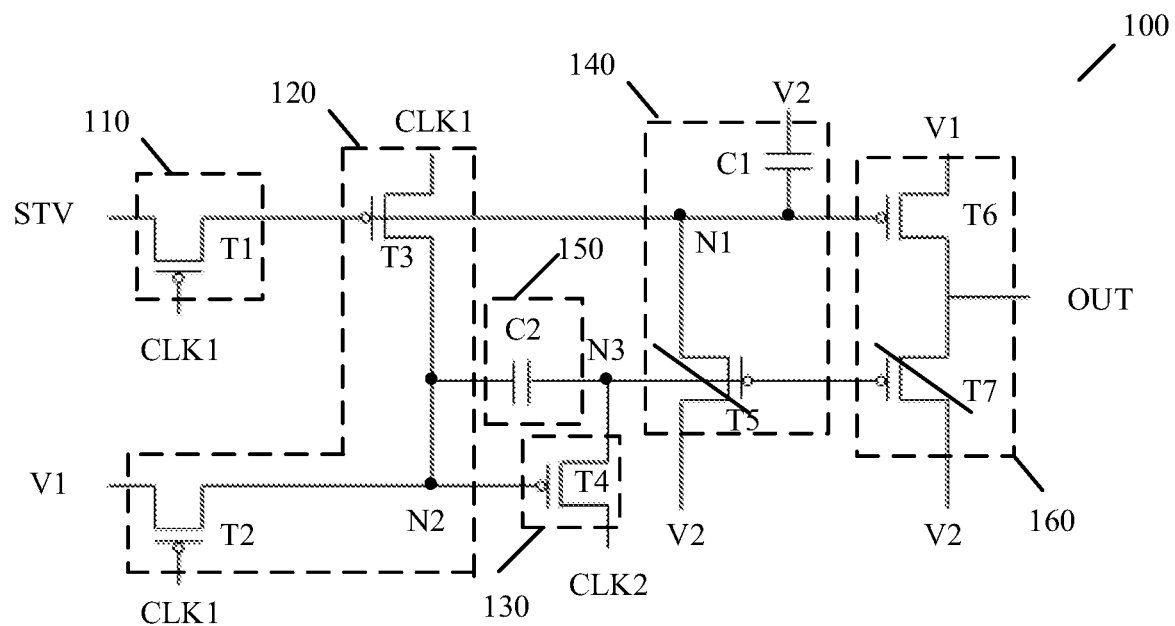
FIG. 6 is an exemplary equivalent circuit diagram of a shift register unit, during the fifth phase, according to an embodiment of the present disclosure.

During the fifth phase t5, STV=0, CK=0, and CKB=1. The equivalent circuit diagram of the shift register unit 100 in this phase is as shown in FIG. 6.

The low voltage signal VGL is inputted to the input terminal STV. Since the low voltage signal VGL is inputted to the first clock signal terminal CLK1, the first transistor T1 is enabled, such that the voltage of the first node N1 is a low voltage. Both the third transistor T3 and the sixth transistor T6 are enabled because the first node N1 has the low voltage. Moreover, the second transistor T2 is enabled by the low voltage signal VGL from the first clock signal terminal CLK1, such that the voltage of the second node N2 is the low voltage. The fourth transistor T4 is enabled by the low voltage of the second node N2, such that the high voltage from the second clock signal terminal CLK2 is inputted to the third node N3. Both the fifth transistor T5 and the seventh transistor T7 are disabled because the third node N3 has the high voltage. The sixth transistor T6 is enabled and the seventh transistor T7 is disabled. Therefore, the low voltage from the first voltage terminal V1 is outputted from the output terminal OUT.

Figure 7:
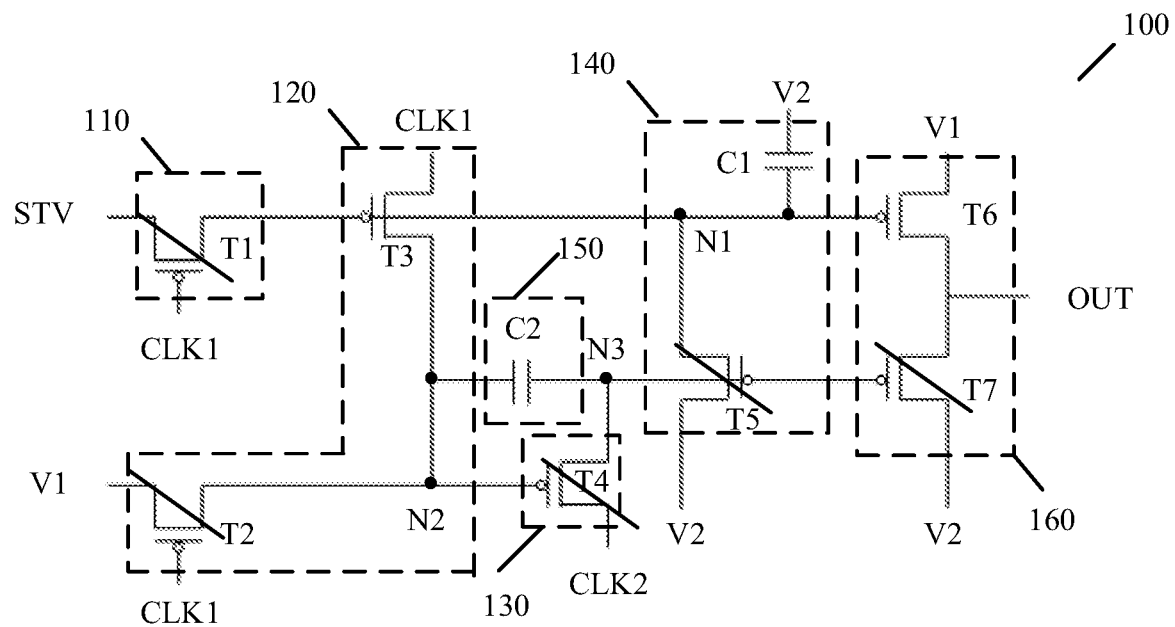
FIG. 7 is an exemplary equivalent circuit diagram of a shift register unit, during the sixth phase, according to an embodiment of the present disclosure.

During the sixth phase t6, STV=0, CK=1, and CKB=0. The equivalent circuit diagram of the shift register unit 100 in this phase is as shown in FIG. 7.

The low voltage signal VGL is inputted to the input terminal STV. Since the high voltage signal VGH is inputted to the first clock signal terminal CLK1, the first transistor T1 is disabled. The voltage of the first node N1 is held as the low voltage by the first capacitor C1. Both the third transistor T3 and the sixth transistor T6 are enabled because the first node N1 has the low voltage. Moreover, the second transistor T2 is disabled by the high voltage signal VGH from the first clock signal terminal CLK1. The high voltage from the first clock signal terminal CLK1 is inputted to the second node N2 via the third transistor T3, such that the voltage of the second node N2 is changed to the high voltage. The high voltage of the second node N2 disables the fourth transistor T4. The voltage of the third node N3 is held as the high voltage by the second capacitor C2. Both the fifth transistor T5 and the seventh transistor T7 are disabled because the third node N3 has the high voltage. The sixth transistor T6 is enabled and the seventh transistor T7 is disabled. Therefore, the low voltage from the first voltage terminal V1 is outputted from the output terminal OUT.

As can be seen from FIG. 3, the shift register unit according to this embodiment can output an output signal having the same duty cycle as that of an input signal, and use the output signal as an input signal of a next-stage shift register unit, so as to implement a shift register circuit having an adjustable duty cycle. For example, if a duration of the high voltage signal of the input signal is N times a pulse duration of the first clock signal, the duration of the high voltage signal of the output signal also is N times the pulse duration of the first clock signal. Moreover, the shift register unit according to this embodiment may be used in shift registers having different functions based on the duty cycle of the input signal. For example, if the duration of the high voltage signal of the input signal is set merely one time the pulse duration of the clock signal, the shift register unit may be used in a shift register for controlling a gate scanning signal. If the duration of the high voltage signal of the input signal is set multiple times the pulse duration of the clock signal, the shift register unit may be used in a shift register for controlling light emission time and time sequence of an OLED.

Those skilled in the art should understand that in an alternative embodiment, all the transistors in the shift register unit 100 as shown in FIG. 2 may be N-type transistors. In this case, the high voltage signal VGH is outputted from the first voltage signal terminal V1, and the low voltage signal VGL is outputted from the second voltage signal terminal V2. The first clock signal CK and the second clock signal CKB have the same clock period and amplitude, and have opposite phases, and a duty cycle of the first clock signal CK and a duty cycle of the second clock signal CKB are both ½. In this alternative embodiment, the voltage (not shown) of each signal in each phase is opposite to that of each signal in each phase as shown in FIG. 3.

Moreover, those skilled in the art also should understand that in other alternative embodiments, it is possible to use more than one type of transistor. That is, a part of the transistors may be N-type transistors, and another part of the transistors may be P-type transistors. Any variation and modification based on the embodiments of the present disclosure should fall within the scope of protection of the present disclosure.

Figure 8:
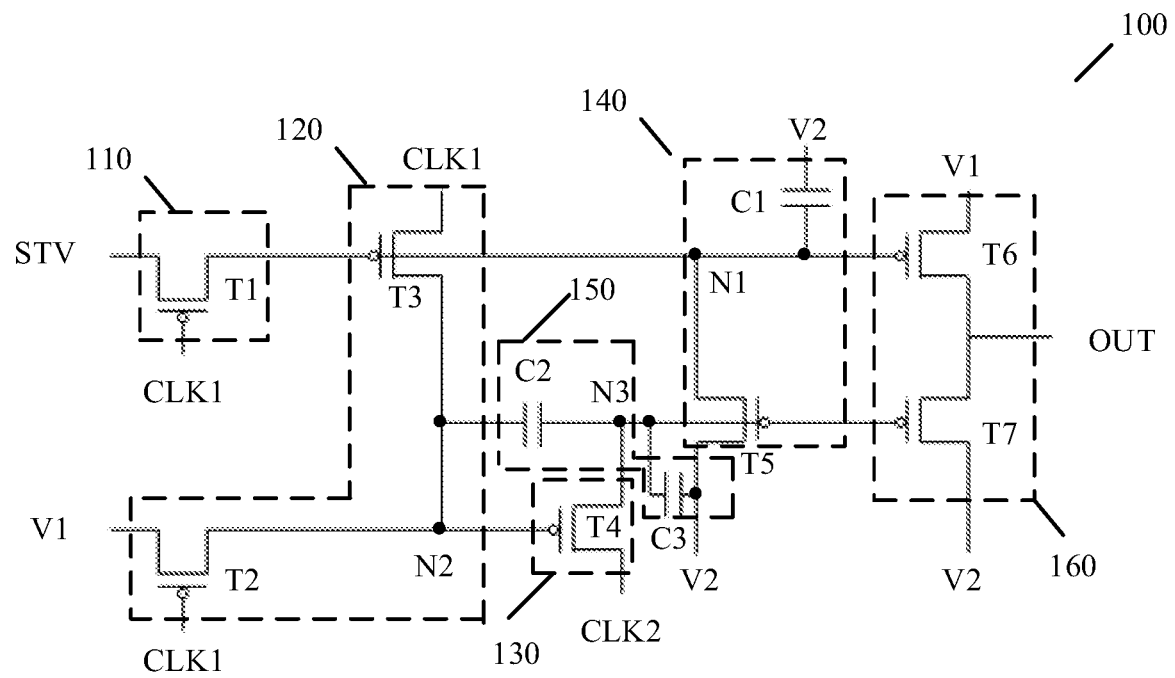
FIG. 8 is an exemplary circuit diagram of a shift register unit according to another embodiment of the present disclosure.

FIG. 8 is an exemplary circuit diagram of a shift register unit 100 according to another embodiment of the present disclosure. The shift register unit 100 in FIG. 8 differs from the shift register unit 100 in FIG. 2 in that a third capacitor C3 is added into the second hold circuit 150. A first terminal of the third capacitor C3 is coupled to the third node N3, and a second terminal of the third capacitor C3 is coupled to the second voltage terminal V2. The second terminal of the third capacitor C3 has a fixed voltage. Therefore, the voltage of the third node N3 can be better held so as to better maintain the stable operation of the shift register unit.

As can be seen from the above description, the shift register unit according to the embodiments of the present disclosure is simple in structure, and may be implemented using a small quantity of transistors, and thus can reduce the layout area. Moreover, the shift register unit according to the embodiment of the present disclosure may have an output signal of an adjustable duty cycle.

Figure 9:
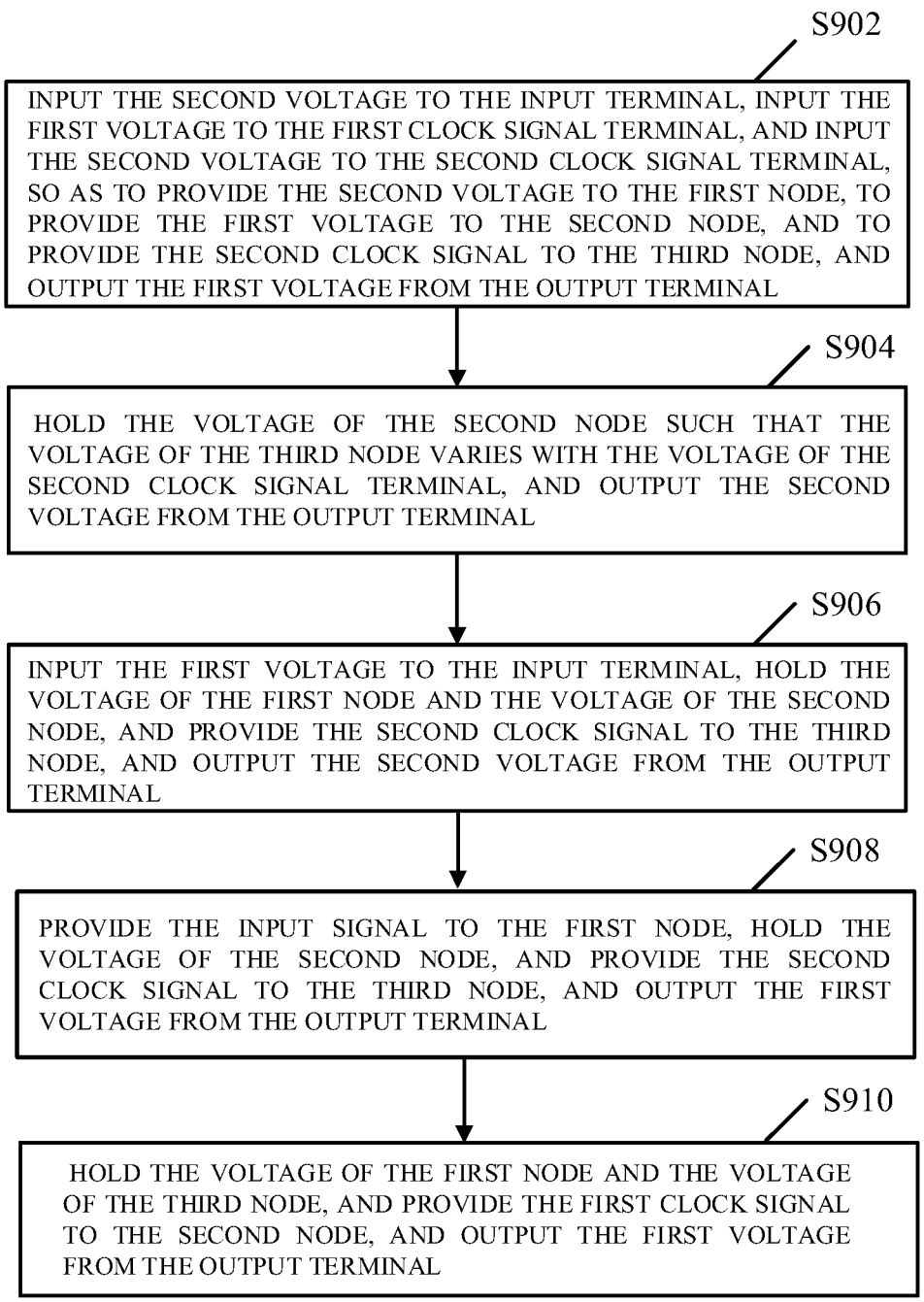
FIG. 9 is a schematic flowchart of a drive method for driving the shift register unit as shown in FIG. 1 according to an embodiment of the present disclosure.

FIG. 9 illustrates a schematic flowchart of a drive method for driving the shift register 100 as shown in FIG. 1 according to an embodiment of the present disclosure. In this embodiment, an input signal of the shift register unit 100 has a first voltage and a second voltage. A duration in which the input signal is at the second voltage is N times a pulse duration of the first clock signal. Here, the N is an odd number. The drive method includes the following phases.

In Step S902, during the first phase, the second voltage is inputted to the input terminal, the first voltage is inputted to the first clock signal terminal, and the second voltage is inputted to the second clock signal terminal, so as to provide the second voltage to the first node, to provide the first voltage to the second node, and to provide the second clock signal to the third node, and the first voltage is outputted from the output terminal.

In Step S904, during the second phase to the $N^{th}$ phase, the second voltage is inputted to the input terminal, the voltage of the second node is held such that the voltage of the third node varies with the voltage of the second clock signal terminal, and the second voltage is outputted from the output terminal.

In Step S906, during the $(N+1)^{th}$ phase, the first voltage is inputted to the input terminal, the second voltage is inputted to the first clock signal terminal, and the first voltage is inputted to the second clock signal terminal, so as to hold the voltage of the first node and the voltage of the second node, and to provide the second clock signal to the third node, and the second voltage is outputted from the output terminal.

In Step S908, during the $(N+2)^{th}$ phase, the first voltage is inputted to the input terminal, the first voltage is inputted to the first clock signal terminal, and the second voltage is inputted to the second clock signal terminal, so as to provide the input signal to the first node, to hold the voltage of the second node, and to provide the second clock signal to the third node, and the first voltage is outputted from the output terminal.

In Step S910, during the $(N+3)^{th}$ phase, the first voltage is inputted to the input terminal, the second voltage is inputted to the first clock signal terminal, and the first voltage is inputted to the second clock signal terminal, so as to hold the voltage of the first node and the voltage of the third node, and to provide the first clock signal to the second node, and the first voltage is outputted from the output terminal.

Figure 10:
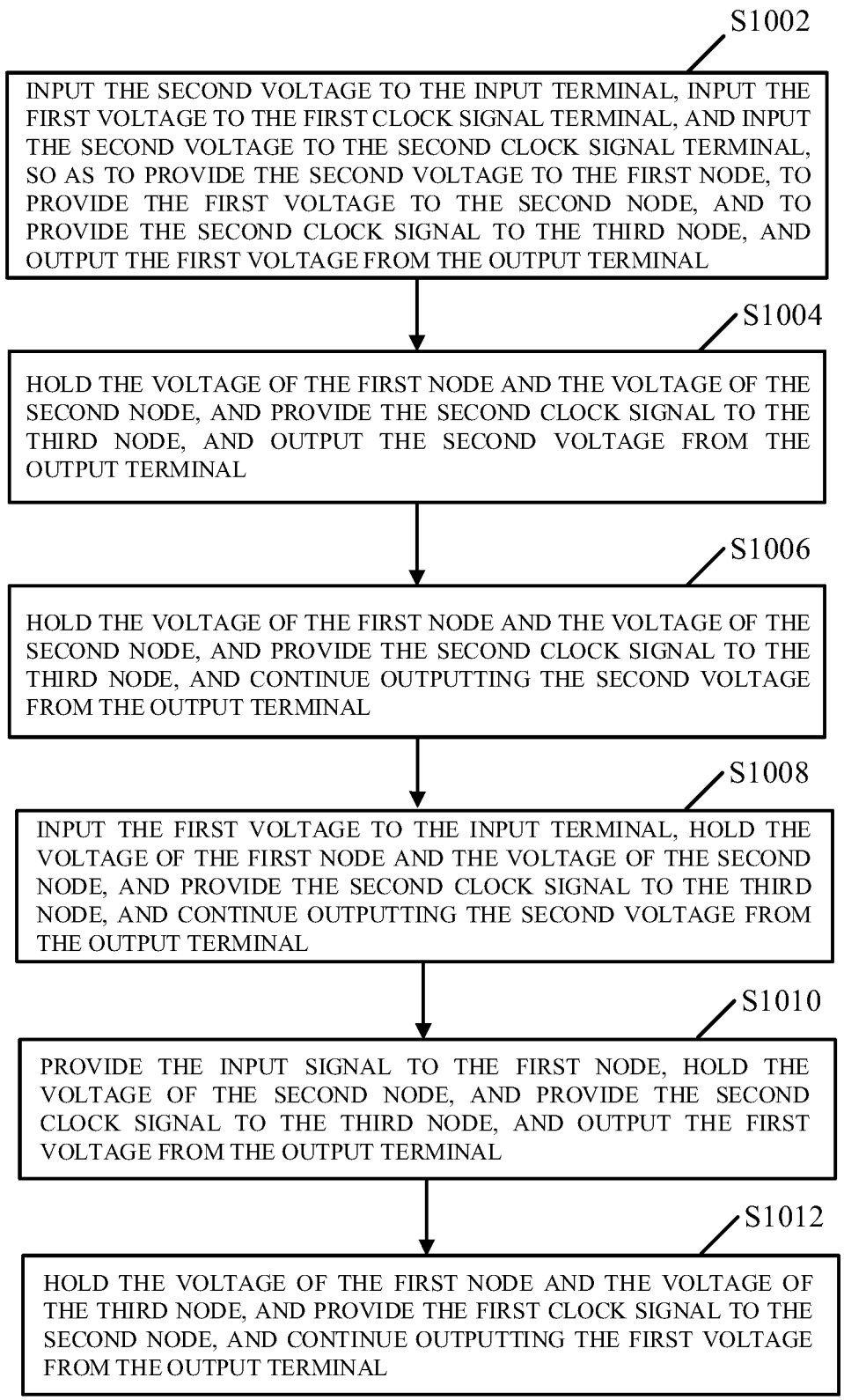
FIG. 10 is a schematic flowchart of a drive method for driving the shift register unit as shown in FIG. 1 according to an embodiment of the present disclosure.

FIG. 10 is a schematic flowchart of an example of the drive method as shown in FIG. 9. In this example, the N is set to 3.

In Step S1002, during the first phase, the second voltage is inputted to the input terminal, the first voltage is inputted to the first clock signal terminal, and the second voltage is inputted to the second clock signal terminal, so as to provide the second voltage to the first node, to provide the first voltage to the second node, and to provide the second clock signal to the third node, and the first voltage is outputted from the output terminal.

In Step S1004, during the second phase, the second voltage is inputted to the input terminal, the second voltage is inputted to the first clock signal terminal, and the first voltage is inputted to the second clock signal terminal, so as to hold the voltage of the first node and the voltage of the second node, and to provide the second clock signal to the third node, and the second voltage is outputted from the output terminal.

In Step S1006, during the third phase, the second voltage is inputted to the input terminal, the first voltage is inputted to the first clock signal terminal, and the second voltage is inputted to the second clock signal terminal, so as to hold the voltage of the first node and the voltage of the second node, and to provide the second clock signal to the third node, and the second voltage is outputted from the output terminal.

In Step S1008, during the fourth phase, the first voltage is inputted to the input terminal, the second voltage is inputted to the first clock signal terminal, and the first voltage is inputted to the second clock signal terminal, so as to hold the voltage of the first node and the voltage of the second node, and to provide the second clock signal to the third node, and the second voltage is outputted from the output terminal.

In Step S1010, during the fifth phase, the first voltage is inputted to the input terminal, the first voltage is inputted to the first clock signal terminal, and the second voltage is inputted to the second clock signal terminal, so as to provide the input signal to the first node, to hold the voltage of the second node, and to provide the second clock signal to the third node, and the first voltage is outputted from the output terminal.

In Step S1012, during the sixth phase, the first voltage is inputted to the input terminal, the second voltage is inputted to the first clock signal terminal, and the first voltage is inputted to the second clock signal terminal, so as to hold the voltage of the first node and the voltage of the third node, and to provide the first clock signal to the second node, and the first voltage is outputted from the output terminal.

In one example of this embodiment, all transistors in the shift register unit 100 are P-type transistors, and the first voltage is a low voltage, and the second voltage is a high voltage.

In another example of this embodiment, all transistors in the shift register unit 100 are N-type transistors, and the first voltage is a high voltage, and the second voltage is a low voltage.

Figure 11:
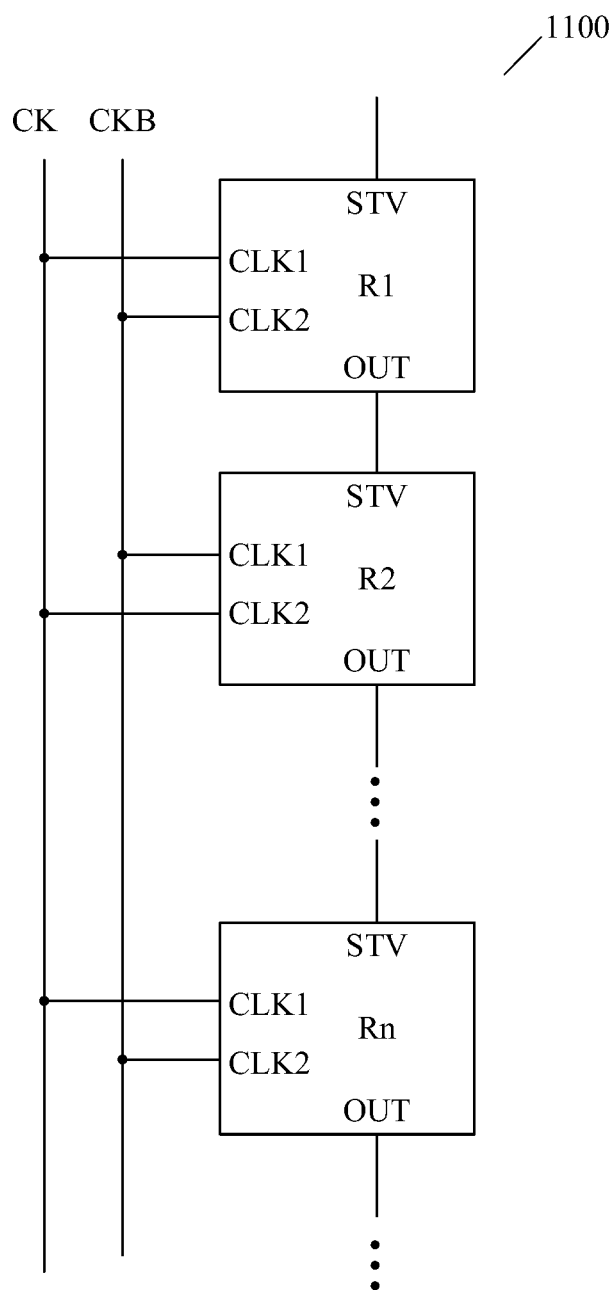
FIG. 11 is an exemplary circuit diagram of a shift register according to an embodiment of the present disclosure.

FIG. 11 is an exemplary circuit diagram of a shift register 1100 according to an embodiment of the present disclosure. As shown in FIG. 11, the shift register 1100 may include a plurality of cascaded shift register units R1, R2 . . . , RN, and so on. Herein, the n represents a certain stage shift register unit among the plurality of cascaded shift register units 100 in the shift register 1100, but does not represent a total number of shift register units included in the shift register 1100.

In this embodiment, the $n^{th}$-stage shift register unit Rn is any one of the shift register units 100 as shown in FIG. 1, FIG. 2 or FIG. 8. An input terminal STV of the $n^{th}$-stage shift register unit Rn is coupled to an output terminal OUT of a previous-stage shift register unit, the first clock signal terminal CLK1 of the $n^{th}$-stage shift register unit Rn is coupled to a second clock signal terminal CLK2 of the previous-stage shift register unit, and the second clock signal terminal CLK2 of the $n^{th}$-stage shift register unit Rn is coupled to the first clock signal terminal CLK1 of the previous-stage shift register unit. An input terminal STV of the first-stage shift register unit R1 is inputted with a start signal.

For example, when n=1, the input terminal STV of the first-stage shift register unit R1 is inputted with the start signal, and the output terminal OUT of the first-stage shift register unit R1 is coupled to the input terminal STV of the second-stage shift register unit. A first clock signal CK is inputted to the first clock signal terminal CLK1 of the first-stage shift register unit R1. A second clock signal CKB is inputted to the second clock signal terminal CLK2 of the first-stage shift register unit R1.

When n=2, the input terminal STV of the second-stage shift register unit R2 is coupled to the output terminal OUT of the first-stage shift register unit R1, and the output terminal OUT of the second-stage shift register unit R2 is coupled to the input terminal STV of the third-stage shift register unit. The second clock signal CKB is inputted to the first clock signal terminal CLK1 of the second-stage shift register unit R2. The first clock signal CK is inputted to the second clock signal terminal CLK2 of the second-stage shift register unit R2.

The subsequent shift registers are connected in the similar way, and thus are not described hereinafter.

The first clock signal and the second clock signal inputted by shift register unit at any stage have the same clock period and amplitude, and have opposite phases. In one example, the duty cycle of the first clock signal and the duty cycle of the second clock signal are both ½.

The shift register according to the embodiments of the present disclosure may be used as a shift register for providing a gate scanning signal so as to be used in a liquid crystal display panel or an OLED display panel.

Moreover, the shift register according to the embodiments of the present disclosure also may be used as a shift register for controlling light emission time and time sequence of an OLED so as to be used in an OLED display panel.

Figure 12:
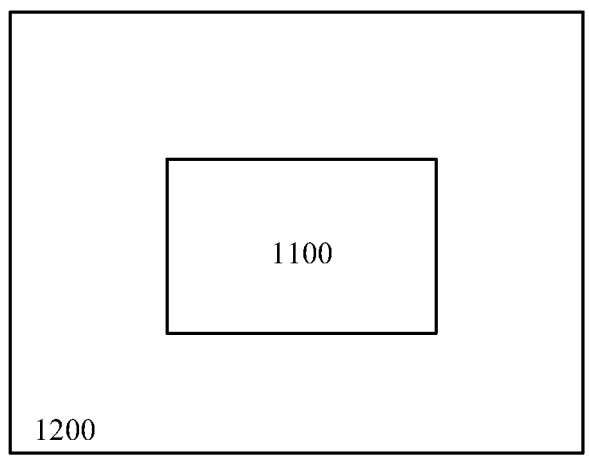
FIG. 12 is a schematic structural diagram of a display device according to an embodiment of the present disclosure.

FIG. 12 illustrates a schematic structural diagram of a display device 1200 according to an embodiment of the present disclosure. The display device 1200 may include the shift register 1100 as shown in FIG. 11. The display apparatus provided by the embodiments of the present disclosure may be used in any product having a display function, such as an electronic paper display, a mobile phone, a tablet computer, a TV set, a notebook computer, a digital photo frame, or a navigation apparatus, and so on.

As used herein and in the appended claims, the singular form of a word includes the plural, and vice versa, unless the context clearly dictates otherwise. Thus, singular words are generally inclusive of the plurals of the respective terms. Similarly, the words "include" and "comprise" are to be interpreted as inclusively rather than exclusively. Likewise, the terms "include" and "or" should be construed to be inclusive, unless such an interpretation is clearly prohibited from the context. Where used herein the term "examples," particularly when followed by a listing of terms is merely exemplary and illustrative, and should not be deemed to be exclusive or comprehensive.

Further adaptive aspects and scopes become apparent from the description provided herein. It should be understood that various aspects of the present disclosure may be implemented separately or in combination with one or more other aspects. It should also be understood that the description and specific embodiments in the present disclosure are intended to describe rather than limit the scope of the present disclosure.

A plurality of embodiments of the present disclosure has been described in detail above. However, apparently those skilled in the art may make various modifications and variations on the embodiments of the present disclosure without departing from the spirit and scope of the present disclosure. The scope of protecting of the present disclosure is limited by the appended claims.

What is claimed is:

1. A shift register unit comprising an input circuit, a first control circuit, a second control circuit, a first hold circuit, a second hold circuit, and an output circuit;
    wherein the input circuit is directly connected to the first control circuit, the first hold circuit and the output circuit via a first node, and configured to control a voltage of the first node based on an input signal from an input terminal and a first clock signal from a first clock signal terminal;
    wherein the first control circuit is connected to the second hold circuit and the second control circuit via a second node, and configured to control a voltage of the second node based on a first voltage from a first voltage terminal, the first clock signal, and the voltage of the first node;
    wherein the second control circuit is connected to the first hold circuit, the second hold circuit and the output circuit via a third node, and configured to control a voltage of the third node based on the voltage of the second node and a second clock signal from a second clock signal terminal;
    wherein the first hold circuit is configured to hold the voltage of the first node based on a second voltage from a second voltage terminal and the voltage of the third node;
    wherein the second hold circuit is configured to hold the voltage of the second node and the voltage of the third node; and
    wherein the output circuit is configured to output the first voltage or the second voltage from an output terminal under the control of the voltage of the first node and the voltage of the third node.

2. The shift register unit according to claim 1, wherein the input circuit comprises a first transistor; and
    wherein a control electrode of the first transistor is coupled to the first clock signal terminal, a first electrode of the first transistor is coupled to the input terminal, and a second electrode of the first transistor is coupled to the first node.

3. The shift register unit according to claim 1, wherein the first control circuit comprises a second transistor and a third transistor;
    wherein a control electrode of the second transistor is coupled to the first clock signal terminal, a first electrode of the second transistor is coupled to the first voltage terminal, and a second electrode of the second transistor is coupled to the second node; and
    wherein a control electrode of the third transistor is coupled to the first node, a first electrode of the third transistor is coupled to the first clock signal terminal, and a second electrode of the third transistor is coupled to the second node.

4. The shift register unit according to claim 1, wherein the second control circuit comprises a fourth transistor; and
    wherein a control electrode of the fourth transistor is coupled to the second node, a first electrode of the fourth transistor is coupled to the second clock signal terminal, and a second electrode of the fourth transistor is coupled to the third node.

5. The shift register unit according to claim 1, wherein the first hold circuit comprises a first capacitor and a fifth transistor;
    wherein a first terminal of the first capacitor is coupled to the second voltage terminal, and a second terminal of the first capacitor is coupled to the first node; and wherein a control electrode of the fifth transistor is coupled to the third node, a first electrode of the fifth transistor is coupled to the second voltage terminal, and a second electrode of the fifth transistor is coupled to the first node.

6. The shift register unit according to claim 1, wherein the second hold circuit comprises a second capacitor; and
wherein a first terminal of the second capacitor is coupled to the second node, and a second terminal of the second capacitor is coupled to the third node.

7. The shift register unit according to claim 6, wherein the second hold circuit further comprises a third capacitor; and
wherein a first terminal of the third capacitor is coupled to the third node, and a second terminal of the third capacitor is coupled to the second voltage terminal.

8. The shift register unit according to claim 1, wherein the output circuit comprises a sixth transistor and a seventh transistor;
wherein a control electrode of the sixth transistor is coupled to the first node, a first electrode of the sixth transistor is coupled to the first voltage terminal, and a second electrode of the sixth transistor is coupled to the output terminal; and
wherein a control electrode of the seventh transistor is coupled to the third node, a first electrode of the seventh transistor is coupled to the second voltage terminal, and a second electrode of the seventh transistor is coupled to the output terminal.

9. The shift register unit according to claim 1, wherein all transistors in the shift register unit are P-type transistors, a low voltage signal is provided from the first voltage terminal, and a high voltage signal is provided from the second voltage terminal.

10. The shift register unit according to claim 1, wherein all the transistors in the shift register unit are N-type transistors, a high voltage signal is provided from the first voltage terminal, and a low voltage signal is provided from the second voltage terminal.

11. The shift register unit according to claim 1, wherein the first clock signal and the second clock signal have the same clock period and amplitude, and have opposite phases, and a duty cycle of the first clock signal and a duty cycle of the second clock signal are both ½.

12. A shift register unit comprising a first transistor, a second transistor, a third transistor, a fourth transistor, a fifth transistor, a sixth transistor, a seventh transistor, a first capacitor, a second capacitor, and a third capacitor;
wherein a control electrode of the first transistor is coupled to a first clock signal terminal, a first electrode of the first transistor is coupled to an input terminal, and a second electrode of the first transistor is coupled to a first node;
wherein a control electrode of the second transistor is coupled to the first clock signal terminal, a first electrode of the second transistor is coupled to a first voltage terminal, and a second electrode of the second transistor is coupled to a second node;
wherein a control electrode of the third transistor is coupled to the first node, a first electrode of the third transistor is coupled to the first clock signal terminal, and a second electrode of the third transistor is coupled to the second node;
wherein a control electrode of the fourth transistor is coupled to the second node, a first electrode of the fourth transistor is coupled to a second clock signal terminal, and a second electrode of the fourth transistor is coupled to a third node;
wherein a first terminal of the first capacitor is coupled to a second voltage terminal, and a second terminal of the first capacitor is coupled to the first node;
wherein a control electrode of the fifth transistor is coupled to the third node, a first electrode of the fifth transistor is coupled to the second voltage terminal, and a second electrode of the fifth transistor is coupled to the first node;
wherein a first terminal of the second capacitor is coupled to the second node, and a second terminal of the second capacitor is coupled to the third node;
wherein a first terminal of the third capacitor is coupled to the third node, and a second terminal of the third capacitor is coupled to the second voltage terminal;
wherein a control electrode of the sixth transistor is coupled to the first node, a first electrode of the sixth transistor is coupled to the first voltage terminal, and a second electrode of the sixth transistor is coupled to the output terminal; and
wherein a control electrode of the seventh transistor is coupled to the third node, a first electrode of the seventh transistor is coupled to the second voltage terminal, and a second electrode of the seventh transistor is coupled to the output terminal.

13. The shift register unit according to claim 12 further comprising a third capacitor, wherein a first terminal of the third capacitor is coupled to the third node, and a second terminal of the third capacitor is coupled to the second voltage terminal.

14. A drive method for driving the shift register unit according to claim 1, wherein an input signal of the shift register unit has a first voltage and a second voltage, wherein a duration in which the input signal is at the second voltage is N times a pulse duration of the first clock signal, and wherein the N is an odd number;
wherein the drive method comprises:
during a first phase, inputting the second voltage to the input terminal, inputting the first voltage to the first clock signal terminal, and inputting the second voltage to the second clock signal terminal, so as to provide the second voltage to the first node, to provide the first voltage to the second node, and to provide the second clock signal to the third node, and outputting the first voltage from the output terminal;
during a second phase to a $N^{th}$ phase, holding the voltage of the second node such that the voltage of the third node varies with the voltage of the second clock signal terminal, and outputting the second voltage from the output terminal;
during a $(N+1)^{th}$ phase, inputting the first voltage to the input terminal, holding the voltage of the first node and the voltage of the second node, and providing the second clock signal to the third node, and outputting the second voltage from the output terminal;
during a $(N+2)^{th}$ phase, providing the input signal to the first node, holding the voltage of the second node, and providing the second clock signal to the third node, and outputting the first voltage from the output terminal; and
during a $(N+3)^{th}$ phase, holding the voltage of the first node and the voltage of the third node, and providing the first clock signal to the second node, and outputting the first voltage from the output terminal.

15. The drive method according to claim 14, wherein the N is set to 3, and the drive method comprises:
during the first phase, inputting the second voltage to the input terminal, inputting the first voltage to the first clock signal terminal, and inputting the second voltage to the second clock signal terminal, so as to provide the second voltage to the first node, to provide the first voltage to the second node, and to provide the second clock signal to the third node, and outputting the first voltage from the output terminal;

during the second phase, holding the voltage of the first node and the voltage of the second node, and providing the second clock signal to the third node, and outputting the second voltage from the output terminal;

during a third phase, holding the voltage of the first node and the voltage of the second node, and providing the second clock signal to the third node, and continuing outputting the second voltage from the output terminal;

during a fourth phase, inputting the first voltage to the input terminal, holding the voltage of the first node and the voltage of the second node, and providing the second clock signal to the third node, and continuing outputting the second voltage from the output terminal;

during a fifth phase, providing the input signal to the first node, holding the voltage of the second node, and providing the second clock signal to the third node, and outputting the first voltage from the output terminal; and during a sixth phase, holding the voltage of the first node and the voltage of the third node, and providing the first clock signal to the second node, and continuing outputting the first voltage from the output terminal.

16. A shift register comprising a plurality of cascaded shift register units according to claim 1, wherein an input terminal of each of the shift register units at any stages is coupled to an output terminal of a previous-stage shift register unit, and a first clock signal of each of the shift register units at any stages has an opposite phase with respect to a first clock signal of the previous-stage shift register unit; and wherein an input terminal of a first-stage shift register unit is inputted with a start signal.

17. A display device comprising the shift register according to claim 16.

18. A drive method for driving the shift register unit according to claim 12, wherein an input signal of the shift register unit has a first voltage and a second voltage, wherein a duration in which the input signal is at the second voltage is N times a pulse duration of the first clock signal, and wherein the N is an odd number;

wherein the drive method comprises:

during a first phase, inputting the second voltage to the input terminal, inputting the first voltage to the first clock signal terminal, and inputting the second voltage to the second clock signal terminal, so as to provide the second voltage to the first node, to provide the first voltage to the second node, and to provide the second clock signal to the third node, and outputting the first voltage from the output terminal;

during a second phase to a $N^{th}$ phase, holding the voltage of the second node such that the voltage of the third node varies with the voltage of the second clock signal terminal, and outputting the second voltage from the output terminal;

during a $(N+1)^{th}$ phase, inputting the first voltage to the input terminal, holding the voltage of the first node and the voltage of the second node, and providing the second clock signal to the third node, and outputting the second voltage from the output terminal;

during a $(N+2)^{th}$ phase, providing the input signal to the first node, holding the voltage of the second node, and providing the second clock signal to the third node, and outputting the first voltage from the output terminal; and during a $(N+3)^{th}$ phase, holding the voltage of the first node and the voltage of the third node, and providing the first clock signal to the second node, and outputting the first voltage from the output terminal.

19. A shift register comprising a plurality of cascaded shift register units according to claim 12, wherein an input terminal of each of the shift register units at any stages is coupled to an output terminal of a previous-stage shift register unit, and a first clock signal of each of the shift register units at any stages has an opposite phase with respect to a first clock signal of the previous-stage shift register unit; and wherein an input terminal of a first-stage shift register unit is inputted with a start signal.

20. A display device comprising the shift register according to claim 19.

* * * * *